United States Patent [19]

Ng et al.

[11] Patent Number: 5,977,750
[45] Date of Patent: Nov. 2, 1999

[54] BATTERY DIAGNOSTIC METHOD AND APPARATUS

[75] Inventors: Patrick Kwok-Yeung Ng, Plano; Gary Jay Turner, Garland; A. S. Herbert, Richardson, all of Tex.

[73] Assignee: Lucent Technologies, Inc., Murray Hill, N.J.

[21] Appl. No.: 09/062,961

[22] Filed: Apr. 20, 1998

[51] Int. Cl.[6] .......................... H01M 10/44; H01M 10/46
[52] U.S. Cl. .................................. 320/132; 320/DIG. 21
[58] Field of Search ...................... 320/110, 125, 320/130, 131, 132, 135, 136, DIG. 19, DIG. 21; 324/427, 432; 340/636

[56] References Cited

U.S. PATENT DOCUMENTS

| | | | |
|---|---|---|---|
| 4,876,513 | 10/1989 | Brilmyer et al. | 340/636 X |
| 5,444,378 | 8/1995 | Rogers | 324/431 X |
| 5,631,540 | 5/1997 | Nguyen | 320/132 |

*Primary Examiner*—Edward H. Tso
*Attorney, Agent, or Firm*—Locke Liddell & Sapp LLP

[57] ABSTRACT

An apparatus and method for initiating an intelligent battery discharge in an electrical system thereby allowing battery diagnostic testing to be performed more efficiently and more accurately. Specifically, the discharge is initiated by reducing the voltage being supplied to the electrical system by a main power supply such that the battery power supply begins supplying the system voltage. The output of the main power supply is only reduced to a predetermined non-zero level, such that the battery power supply will begin discharging while the main power supply continues to maintain a floor voltage. This floor voltage ensures that the system voltage will not fall below the floor voltage even if the battery power supply fails completely. Once the battery power supply begins discharging, the system voltage is monitored to determine whether the battery power supply is capable of supplying sufficient electrical power to maintain the system voltage above the floor voltage. If after a certain time the system voltage supplied by the battery power supply remains above the floor voltage, the voltage supplied by the main power supply is further reduced to allow for a deeper discharge of the battery power supply. The battery discharge is terminated either when the system voltage reaches a certain voltage level or once enough time has passed to obtain sufficient battery parameters in order to determine the condition of the battery power supply. The battery discharge is terminated by increasing the voltage supplied by the main power supply back to a normal voltage level for the electrical system, thus removing the need for the battery power supply to continue supplying the system voltage.

30 Claims, 3 Drawing Sheets

BATTERY DIAGNOSTIC METHOD AND APPARATUS

FIELD OF THE INVENTION

The present invention relates to an apparatus and method for initiating an intelligent battery discharge in order to monitor and diagnose the health of a battery in an electrical system. More particularly, it is concerned with the automated method and apparatus for initiating a battery discharge while maintaining a floor voltage in the electrical system, such that battery diagnostics can be performed while preventing a loss of system power due to a battery failure.

BACKGROUND OF THE INVENTION

As electrical devices and systems have become increasingly prevalent in consumer and industrial applications, there has been a corresponding increase in the use of batteries. The uses of batteries to supply electrical power are as varied as the electrical devices or systems in which they are used. Some electrical systems, such as portable electronic devices, use batteries as their primary source of electrical energy. Other electrical systems or devices receive their primary supply of electrical power from a power source such as a generator, power plant, or line power supply. Even these devices often utilize batteries, however, as a back-up or secondary supply of electrical power. In such battery-backed systems, if the primary power source fails, the battery can be used to supply electrical power until the primary power supply is reinstated. This scheme of redundant power sources is often utilized in electrical devices or systems in which a temporary loss of power is problematic. Such systems include very complex as well as relatively simple applications. Examples include alarm clocks, where a loss of power could result in the clock losing track of the proper time thus resulting in a false or a late alarm; computers, where an untimely loss of power could result in lost data; and telecommunications systems, where a loss of power could result in a shutdown of communications networks.

As used herein, the term battery will include both a singular device used to store electrical energy as well as multiple storage devices connected in an array or other configuration to provide additive storage capacity. The process of storing electrical energy or power into a battery is referred to as charging the battery. Conversely, the process of removing or using the stored electrical energy from a battery is referred to as discharging the battery. In battery-backed systems, i.e., systems utilizing a non-battery power supply as a primary power supply with a battery as a back-up or secondary power supply, the primary power may be connected such that the battery will be automatically and continuously charged by the primary power supply. This ensures that the battery will be fully charged and ready for use when and if the primary power supply fails.

It should be noted that the total amount of energy which can be stored in a battery, i.e. a battery's total capacity, depends not only on the type and size of the battery, but also on the age of the battery and its operating environment during life. In application, all batteries slowly begin an ageing process which results in a continuing decrease in a battery's available capacity and in other performance characteristics. This deterioration in a battery's performance is typically caused by an increase of internal resistance in the battery caused by water loss, grid corrosion/deterioration, bad cells, or other deleterious means.

In systems which rely on batteries to supply electrical power, either as the primary or secondary power supply, battery performance is counted on and therefore must be reliable. In those electrical devices or systems in which a temporary loss of power is problematic ensuring proper battery performance can be a critical system design feature. In many systems which utilize a battery, then, it is important to monitor the condition or health of the battery. Several methods and apparatus are available for determining the condition of a battery by monitoring certain battery parameters during a battery discharge which are indicative of the battery's performance. Specifically, one approach for determining the remaining capacity (Q) and reserve time (t) of a discharging battery is disclosed in U.S. Pat. No. 4,876,513. This method takes advantage of the fact that when battery voltages (corrected for internal resistance) are plotted versus a ratio of ampere-hours remaining to ampere-hours available to a certain discharge voltage, all discharge curves fall on a single curve. The battery voltages are calculated using a battery internal resistance and discharge current that are measured periodically during discharge. An even more accurate apparatus and method of predicting remaining battery capacity and reserve time of a discharging battery to a selected end voltage is disclosed in U.S. Pat. No. 5,631,540. In this patent, the battery reserve time (t) of a discharging battery is determined by an arrangement considering the discharge current (I), battery voltage (V), battery temperature (T), and the battery's internal resistance ($R_{int}$). The remaining battery capacity (Q) is determined from the ratio between a maximum theoretical capacity ($Q_{max}$) and its present capacity ($Q_{present}$). This normalized battery capacity value is plotted versus a temperature-corrected battery overvoltage ($\eta$) to produce a discharge characteristic curve that is invariant to discharge rate, temperature, and battery size. A reserve time (t) can then be calculated from the determined capacity value (Q) using the relation:

$$t = \frac{Q}{I}.$$

Utilizing a computer, this method can provide continuing real time prediction of the remaining capacity (Q) and reserve time (t) of the battery on discharge. By comparing these performance characteristics to base or normal criteria for a new or healthy battery, one can determine the relative condition or health of the battery. Although any of these or other battery diagnostic methods can be used to measure battery performance and thus determine the condition of the battery, it should be noted that the most accurate methods of analyzing a battery's condition require monitoring the battery's performance during a discharge.

Because a battery's performance changes over time, the battery must be monitored on an ongoing basis. Since an accurate analysis of the condition of a battery requires a battery discharge, this means battery discharges must occur in frequent intervals in order to accurately monitor the condition of the battery over time. In addition to a frequency requirement, the battery discharges must be of a certain duration in order to provide enough time to collect sufficient data on the battery's performance to perform the necessary battery diagnostics. In practice, however, normal battery discharges in a system may be infrequent and/or of insufficient duration to adequately monitor the condition of the battery. In particular, systems which operate from a primary power source and use a battery for back-up power may not use the battery for days, months, or even years. In such systems, by the time a battery discharge occurs sufficient to test the battery, the battery may already be defective. Accordingly, it is often necessary to manipulate the system to initiate a battery discharge specifically in order to monitor the battery's condition.

Previously, the necessary battery discharges would be initiated by simply disconnecting or turning off the main (non-battery) power supply, such that the system would begin relying on the battery to supply electrical power. For systems in which a temporary power loss is problematic, this method presented a risky proposition, i.e. turning off the primary power supply, thereby relying on the battery to supply power, in order to test if the battery is still good. Using this method, by the time one learns that the battery is defective, the system may already have lost power causing a complete system failure.

Alternatively, the battery can be tested "off-line" meaning the battery is disconnected from the system for testing. Once the battery is disconnected from the system, a test load is connected to the battery and the condition of the battery can be monitored while discharging over the test load. Although this off-line testing method reduces the risk of a complete system failure, as opposed to simply disconnecting the main power supply and thereby causing a battery discharge, this method is typically more burdensome to perform both in terms of additional hardware required, i.e., the required test load and battery disconnect circuitry, as well as any labor required to disconnect the battery from the system. In addition, this method also presents some risk of system failure. Specifically, if the main system power supply fails while the battery is off-line and disconnected from the system, there will effectively be no battery back-up and a complete system failure can occur. Finally, it should be noted that a discharge over a test load may not accurately simulate a true battery discharge in the system, which may affect the accuracy of the results from the diagnostic testing performed.

SUMMARY OF THE INVENTION

To this end, in accordance with the present invention, there is provided an automated method and apparatus for initiating a battery discharge over the system load in order to monitor the condition of the battery in an accurate and efficient manner which also reduces the risk of a complete shutdown of the system if either the battery or main power supply fails.

The inventive method of monitoring the health and condition of a battery in an electrical system, comprises the steps of: initiating a battery discharge by reducing the voltage supplied by a main power supply from a normal voltage level to a predetermined first voltage level; sensing a system voltage level supplied by a battery power supply greater than the first voltage level; further reducing the voltage supplied by the main power supply to a predetermined second voltage level; monitoring battery parameters indicative of battery performance during the battery discharge; terminating the battery discharge by increasing the voltage level supplied by the main power supply to the normal voltage level; and using the battery parameters to determine the condition of the battery power supply.

An alternative embodiment of the method of the present invention comprises the steps of: initiating a battery discharge by reducing the voltage supplied by a main power supply from a normal voltage to a predetermined floor voltage; sensing a system voltage supplied by a battery power supply greater than said floor voltage; monitoring battery parameters indicative of battery performance during the battery discharge; terminating the battery discharge by increasing the voltage supplied by the main power supply to the normal voltage; and using the battery parameters to determine the condition of the battery power supply.

The inventive apparatus for determining the condition and health of a battery in an electrical system, comprises: a main power supply connected to primarily supply voltage to an electrical system; a battery power supply connected to secondarily supply voltage to the electrical system; voltage adjusting circuitry connected to adjust the voltage supplied by the main power supply; sensing circuitry connected to monitor system voltage and battery performance parameters during a battery discharge; a battery diagnostic unit connected to receive input from the sensing circuitry and to provide output to the voltage adjusting circuitry, having a controller, wherein the controller uses input from the sensing circuitry to determine the condition of the battery power supply.

DETAILED DESCRIPTION OF THE DRAWINGS

Figure 1:
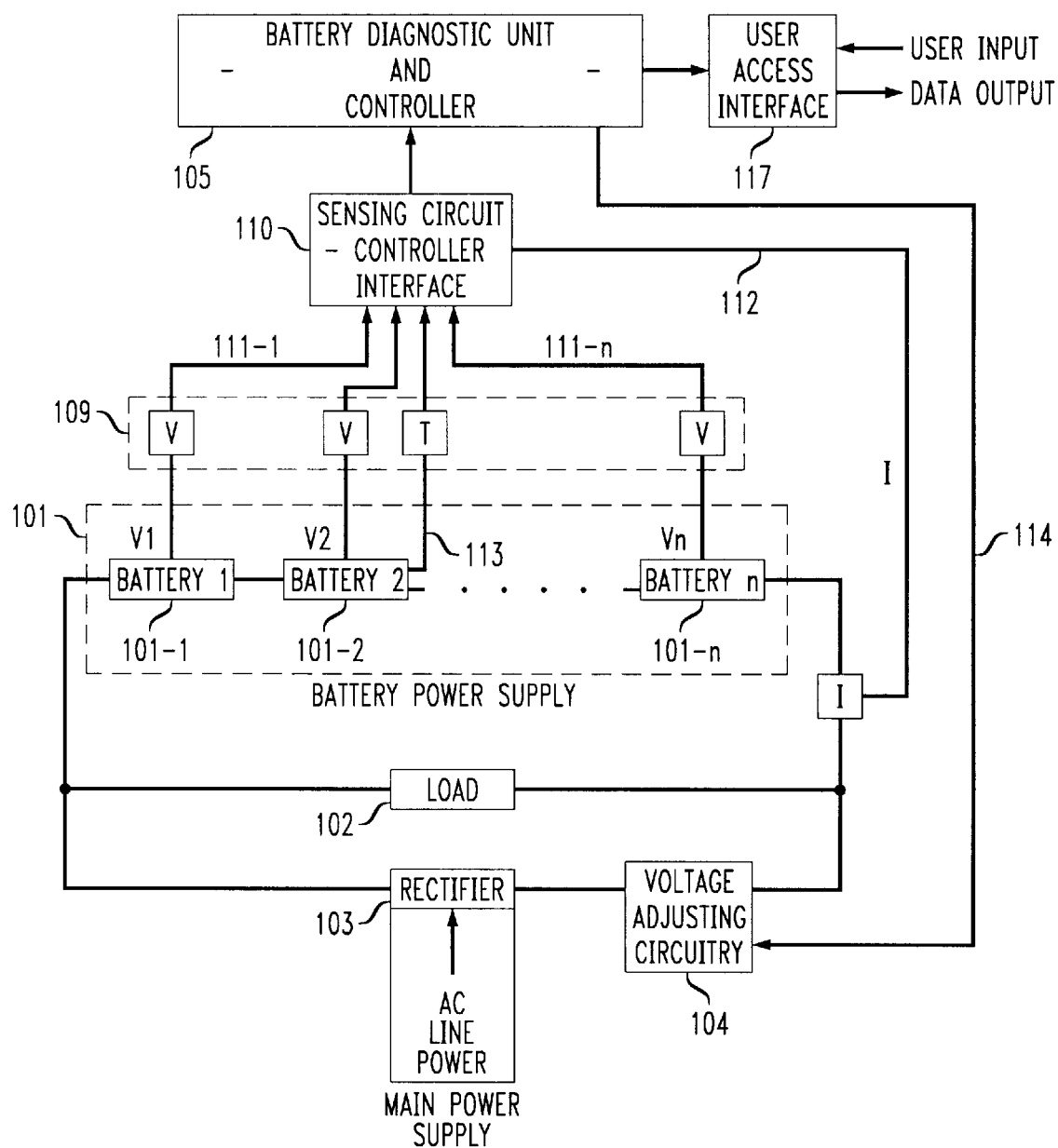
FIG. 1 is a block schematic of an electrical system incorporating an embodiment of the battery diagnostic apparatus of the present invention.

FIG. 1 provides a block schematic illustrating an electrical system incorporating the battery diagnostic apparatus of the present invention. The system shown in FIG. 1 includes a main power supply 103 connected to primarily supply power to the system's load 102. The main power supply 103 typically comprises a rectifier circuit connected to an AC primary power line in order to provide rectified voltage to the load 102. Although a rectifier tied to an AC power line is shown in FIG. 1, other primary power supplies are contemplated by the present invention such as generators, power plants, transformers, converters, and other power generating and power delivery devices.

A battery power supply 101 is connected to secondarily supply power to the load 102. More particularly, the battery power supply 101 is connected in parallel with the main power supply 103 and the load 102. With this configuration, if the main power supply 103 fails, or is otherwise interrupted, the battery power supply 101 will automatically begin to discharge in order to continue the supply of electrical power to the load 102. This configuration also allows the main power supply 103 to provide a rectified charging voltage to automatically and continuously recharge the battery power supply 101. This ensures that the battery power supply 101 will be fully charged and ready for use when and if the main power supply 103 fails. The battery power supply 101 shown in FIG. 1 comprises a plurality of storage devices or battery cells 101-1 to 101-n which are connected in series to provide the required voltage. Multiple such battery strings can be connected in parallel to provide additional storage capacity. The amount of battery capacity required is determined by the amount of electrical energy necessary to continue supplying power to the load 102 if the main power supply 103 fails, and the expected duration of any such failure. The greater the battery capacity, the longer the battery power supply 101 will be able to supply electrical energy to the load 102.

Voltage adjusting circuitry 104 is connected to the main power supply 103 in order to adjust the voltage output by the main power supply 103. The voltage adjusting circuitry 104 can be a shunt, voltage dividing circuit, or other circuitry which alters or controls the main power supply 103 voltage. This circuitry can be external to the main power supply 103, or it can be circuitry integral to the main power supply 103 which allows the main power supply 103 to output differing voltage levels, for example circuitry which allows for the rectifier to step up or down the voltage to differing voltage levels. The voltage adjusting circuitry 104 can be externally controlled by a control signal or by simple hardware switching. As shown in FIG. 1, the voltage adjusting circuitry 104 has connection 114 to receive control signals determining how much voltage should be supplied to the load 102 by the main power supply 103. Preferably, the voltage adjusting circuitry 104 will be capable of adjusting the voltage supplied by the main power supply 103 to multiple voltage levels.

A battery diagnostic unit and controller 105 initiates and monitors the battery diagnostics in order to determine the condition of the battery power supply 101. The battery diagnostic unit 105 is connected to a sensing circuitry-to-controller interface 110. The interface 110 is connected to sensing circuitry 109 including connections 111-1 to 111-n either to sense the total battery string voltage or to sense the voltage of each battery cell ($V_1$–$V_n$), a connection 112 to sense the load current (I) and/or each battery string current, and a connection 113 to sense the temperature (T) of at least one battery cell. The controller/battery diagnostic unit 105 is also connected to a user access interface 117 for receiving user input and sending data output. In addition, the controller 105 has a connection 114 to the voltage adjusting circuitry 104. Using this connection, the controller 105 can control the voltage adjusting circuitry 104 to adjust the voltage supplied to the load 102 from the main power supply 103.

As discussed previously, because the system's normally occurring battery discharges may be infrequent and of insufficient duration to adequately measure battery performance and thus battery condition, a battery discharge may have to be initiated in order to monitor battery condition on a regular and ongoing basis. To this end, the battery diagnostic unit 105 can initiate a battery discharge by sending a control signal via connection 114 to the voltage adjusting circuitry 104 thereby lowering the voltage supplied by the main power supply 103 to the load 102. When the voltage drops below the battery open circuit voltage, the battery power supply 101 will then begin supplying power to the load 102, i.e., a battery discharge will begin. By only reducing the voltage supplied by the main power supply 103 to a floor voltage, a battery discharge can be initiated, and the battery power supply 101 can be tested without risk of a complete system shutdown if the battery fails to supply the system power. Not only does this help prevent system failures, it also allows for diagnostic testing of the battery during a discharge over the system load, as opposed to the test load, thereby providing more accurate diagnostic data.

In an alternate embodiment of the present invention, the voltage from the main power supply 103 is initially lowered only slightly to a first predetermined voltage to see if the battery power supply will provide the electrical power to the load 102. If the battery power supply 101 responds, the voltage from the main power supply 103 can be further reduced to a second predetermined voltage level to allow for a longer and deeper battery discharge sufficient to adequately measure battery performance. Regardless whether one or two floor voltages are used, once a sufficient discharge has been completed, the discharge is terminated by the controller 105 thereby allowing the main power supply 103 to return supplying a normal voltage over the load 102.

The battery monitoring unit 105 accepts data from the sensing circuitry interface 110 and from the user input/access device 117. The data from the interface 110 includes the real time voltage (V), current (I), and temperature (T) of the battery plant. Using this data, the controller 105 can determine actual battery performance during a battery discharge. By comparing the actual performance of the battery power supply 101 to an exemplar or base performance for a new battery power supply of similar type, the controller 105 can determine the relative condition of the battery 101. The greater the disparity between the actual performance of the battery 101 and the exemplar or base performance, the worse the relative condition of the battery 101. When the battery condition declines to a predetermined level, the battery power supply 101 must be replaced in order to prevent a system failure when the battery power supply 101 is needed to supply system power.

Figure 2:
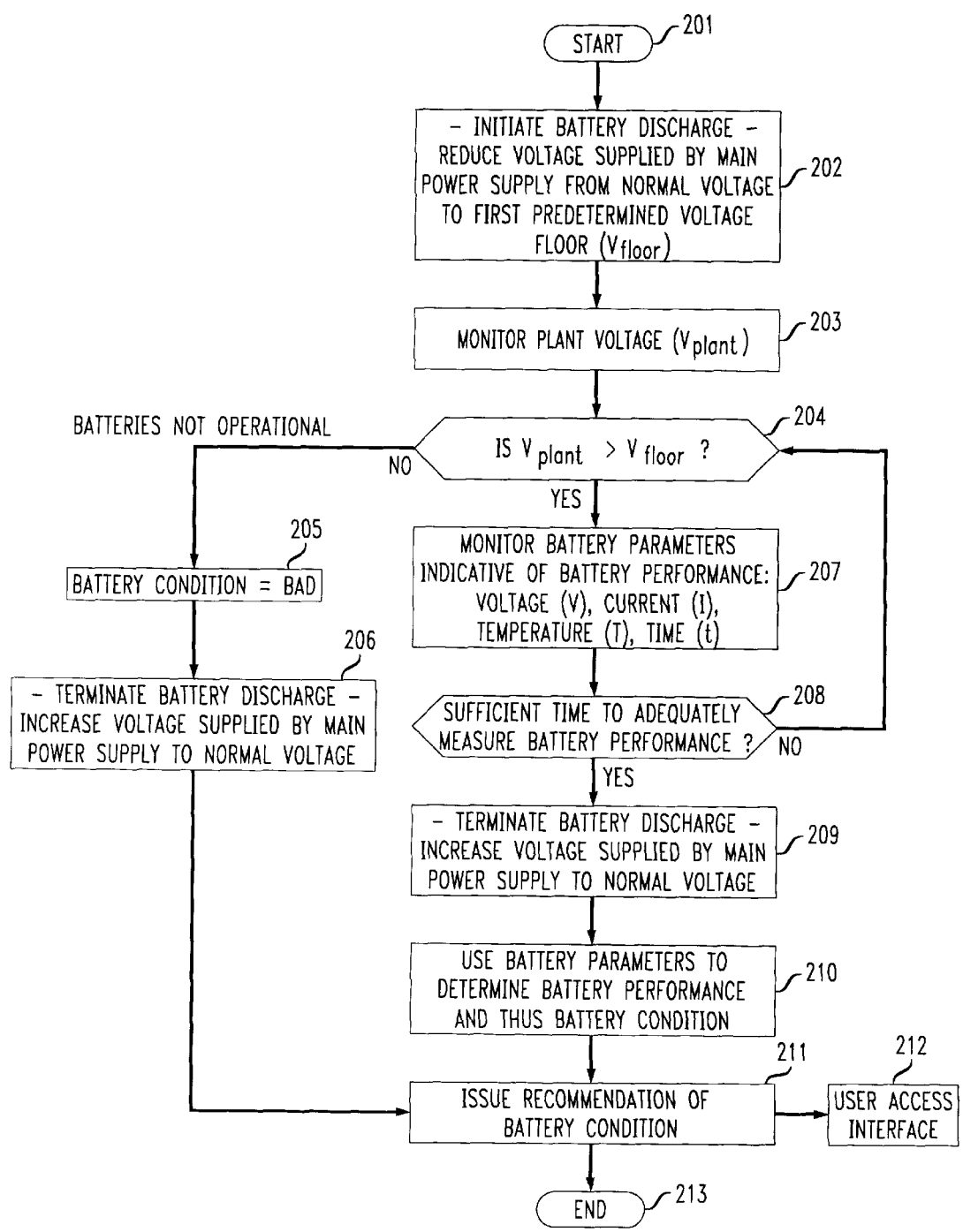
FIG. 2 is a flow graph illustrating an embodiment of the battery diagnostic method of the present invention.

FIG. 2 provides a flow diagram illustrating an embodiment of the method of the present invention for monitoring the health and condition of a battery in an electrical system. In particular, FIG. 2 illustrates an alternative embodiment of the inventive process in which a single floor voltage is used as opposed to two floor voltages. The inventive process starts at terminal 201 and proceeds to block 202 whose instructions require initiating a battery discharge. The battery discharge is initiated by reducing the voltage supplied by the main power supply from the normal voltage required by the system load to a first predetermined voltage floor ($V_{floor}$). As discussed previously, when the voltage from the main power supply is reduced, the battery power supply will necessarily begin to supply voltage to the load to make up for the lost voltage from the main power supply. Thus, a battery discharge begins. Once the discharge has begun, block 203 notes that the system monitors the system or plant voltage ($V_{plant}$). The terms system voltage or plant voltage will be used interchangeably to refer to the voltage over a system or plant which may comprise a single system or a combination of multiple systems or sub-systems. Block 204 determines whether the plant voltage ($V_{plant}$) is greater than a predetermined floor voltage ($V_{floor}$). If the plant voltage ($V_{plant}$) is greater than the floor voltage ($V_{floor}$), then the batteries are operational and are supplying the electrical power to the load. Accordingly, the battery discharge may continue. During the discharge, the system monitors certain battery parameters indicative of battery performance. As noted in block 207, these parameters include voltage (V), current (I), temperature (T), and time (t). As previously discussed, in order to adequately measure battery performance, battery parameters should be collected over a sufficient period of time. Thus, the battery discharge continues for a certain duration. Block 208 determines whether a sufficient amount of time has elapsed to adequately measure the battery performance. If not, the process returns to block 204 which again ensures that the plant voltage ($V_{plant}$) is still greater than the floor voltage ($V_{floor}$). Block 207 continues to monitor and collect battery parameters. Once block 208 determines that a sufficient amount of time has elapsed, the process continues to block 209. Block 209 terminates the battery discharge by increasing the voltage supplied by the main power supply back to the normal voltage. Thus, the battery power supply is no longer required to supply voltage to the load and the battery discharge ends. Once the discharge is terminated, the battery parameters measured during the discharge are used to determine battery performance and thus battery condition, as noted in block 210. Once the battery condition has been determined, the process issues a recommendation as to the battery condition as stated in block 211. As shown in block 212, this recommendation can be output to a user access interface to notify the user of the battery condition. Once a recommendation has been issued the process ends as per terminal 213.

Alternatively, if block 204 determines that the plant voltage ($V_{plant}$) is not greater than the predetermined floor voltage ($V_{floor}$), then the battery power supply is incapable of supplying the electrical power to the load and the batteries must not be operational. Block 205 instructs that in this case the battery condition is immediately known to be bad. Accordingly, the battery discharge should be immediately terminated pursuant to the instructions of block 206. Once the discharge is terminated, the battery monitoring system issues a recommendation as to the battery condition as stated in block 211 which can again be output to a user access interface shown in block 212. Once the recommendation has been issued the abbreviated process ends as per terminal 213.

Figure 3:
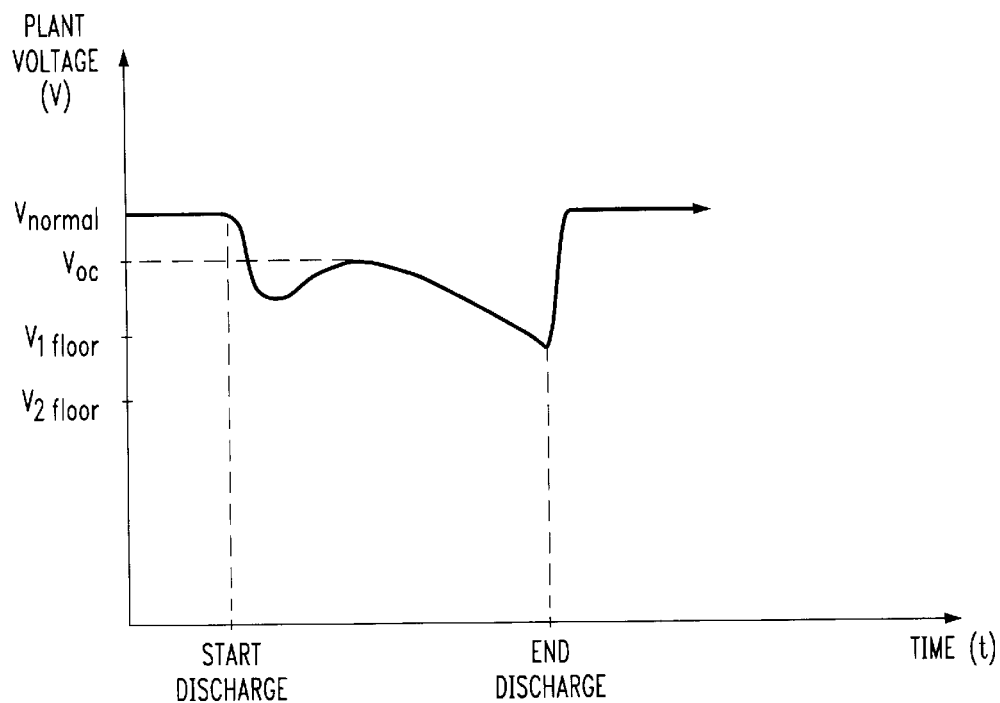
FIG. 3 is a graph of plant voltage versus time, over a time period including a battery discharge.

In FIG. 3, a plant voltage ($V_{plant}$) curve including a battery discharge is plotted versus time (t). The graph of FIG. 3 shows the effect of a battery discharge on the system or plant voltage ($V_{plant}$) where the battery discharge is initiated by the apparatus and method of the present invention. In normal operation, the plant voltage ($V_{plant}$) is at a normal voltage ($V_{normal}$). This normal voltage is supplied to the system/plant by the main power supply. At time $t_{start\ discharge}$, the voltage supplied by the main power supply is reduced to a first predetermined voltage level ($V1_{floor}$). As a result, the battery power supply begins supplying the plant voltage ($V_{plant}$). Thus, the plant voltage ($V_{plant}$) curve begins to take the shape of a typical battery discharge curve wherein the voltage initially drops significantly due to the phenomenon of activation and ohmic resistance, and then recovers. The minimum voltage of this initial drop is called the Coup de Fouet point, after which a gradual decrease in voltage is shown as the battery capacity begins to diminish. By only reducing the voltage supplied by the main power supply to a first predetermined floor voltage ($V1_{floor}$), even if the battery fails, the plant voltage ($V_{plant}$) will not drop past the first floor voltage ($V1_{floor}$) level. This prevents a shutdown of the system even if the battery is defective, and allows the main power supply to return to supplying a normal voltage without interrupting normal system operation.

If the battery power supply does not fail, the plant voltage ($V_{plant}$) will remain above the first floor voltage ($V1_{floor}$). When a plant voltage greater than the first floor voltage is sensed, the battery power supply must be operating. Once assured that the battery power supply is operational, the main power supply can be further reduced to a second predetermined voltage level ($V2_{floor}$). This allows the battery discharge to continue even if the plant voltage drops below the first floor voltage ($V1_{floor}$). Thus, a longer and deeper discharge of the battery is allowed providing sufficient time to analyze battery performance. After the battery discharge has continued for a sufficient time to analyze battery performance, the battery discharge can be terminated. Alternatively, the battery discharge can be terminated if the plant voltage ($V_{plant}$) falls to a certain voltage, i.e., a third predetermined voltage level, at which there is a danger of system failure. The battery discharge is terminated by returning the voltage supplied by the main power supply to the normal voltage ($V_{normal}$). When the main power supply resumes supplying voltage to the system, the battery power supply is no longer needed to supply power, and the battery discharge is complete. The battery discharge shown in FIG. 3 ends at time $t_{end\_discharge}$. When the discharge ends, the plant voltage ($V_{plant}$) returns to the system's normal voltage ($V_{normal}$). It should be noted that the curve in FIG. 3 is not to scale since the typical duration of the Coup de Fouet voltage drop is measured in seconds whereas the typical discharge time may be several hours.

Figure 4:
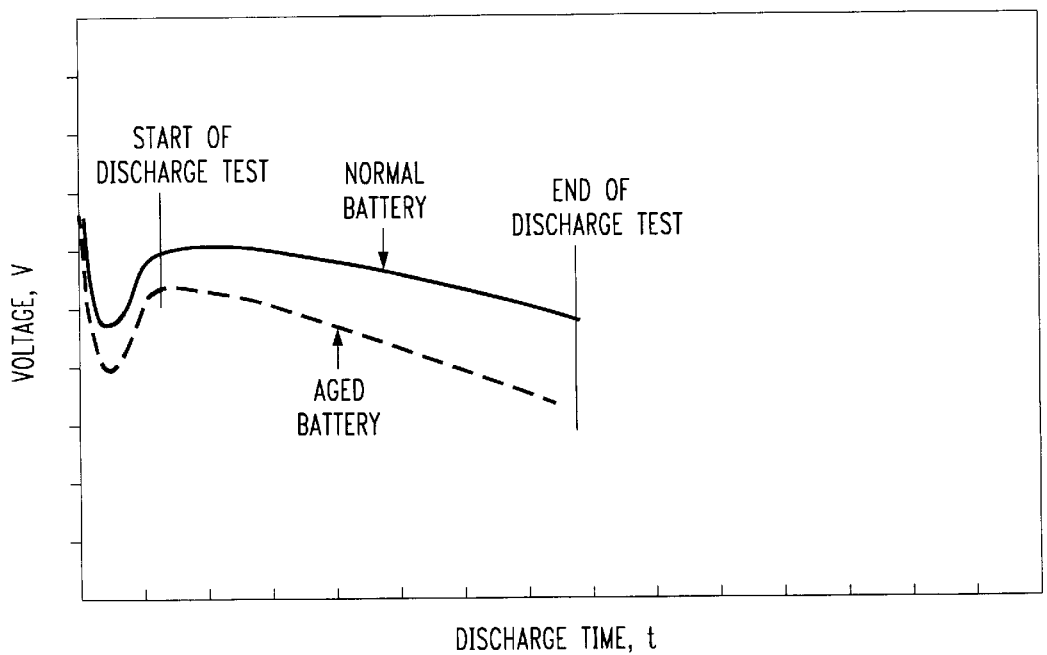
FIG. 4 is a graph of a typical battery discharge curve for a normal battery and an aged battery in terms of battery voltage versus discharge time.

In FIG. 4, a typical discharge curve is plotted for a normal battery and an aged battery in terms of battery voltage (V) versus discharge time (t). The effect of ageing on battery discharge is shown in the graph of FIG. 4. Because a battery's capacity decreases over time, the battery performance during discharge deteriorates. At some point, a battery's performance may deteriorate to a predetermined level at which replacement of the battery is recommended.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A method of monitoring the health and condition of a battery in an electrical system, comprising the steps of:
   a) initiating a battery discharge by reducing the voltage supplied by a main power supply from a normal voltage level to a predetermined first voltage level;
   b) sensing a system voltage level supplied by a battery power supply greater than said first voltage level;
   c) further reducing the voltage supplied by the main power supply to a predetermined second voltage level;
   d) monitoring battery parameters indicative of battery performance during the battery discharge; and
   e) terminating the battery discharge by increasing the voltage level supplied by the main power supply to said normal voltage level.

2. The method as described in claim 1, further comprising the steps of:
   f) using said battery parameters to determine the condition of the battery power supply.

3. The method as described in claim 2, further comprising the steps of:
   g) using the battery condition to determine whether the battery should be replaced.

4. The method as described in claim 2, further comprising the steps of:
   g) displaying the battery condition to a user access interface.

5. The method as described in claim 3, further comprising the steps of:
   h) displaying whether the battery should be replaced to a user access interface.

6. The method as described in claim 2, further comprising the steps of:
   g) activating an alarm if the battery condition has reached a predetermined alarm condition.

7. The method as described in claim 3, further comprising the steps of:
   h) activating an alarm if the battery should be replaced.

8. The method as described in claim 1, wherein the method is repeated at predetermined periodic intervals.

9. The method as described in claim 2, wherein the step of using said battery parameters to determine the condition of the battery power supply further comprises the steps of:
   i) using said battery parameters to determine the actual performance of the battery power supply; and ii) using said actual battery performance to determine the condition of the battery power supply.

10. The method as described in claim 2, wherein the step of using said battery parameters to determine the condition of the battery power supply further comprises the steps of:
   i) using said battery parameters to determine the actual performance of the battery power supply;
   ii) comparing said actual battery performance to the base performance of a healthy battery supply; and
   iii) using the comparison between said actual battery performance and said base performance to determine the condition of the battery power supply.

11. The method as described in claim 2, wherein the step of using said battery parameters to determine the condition of the battery power supply further comprises the steps of:
   i) using said battery parameters to determine the battery capacity; and
   ii) using said battery capacity to determine the battery condition.

12. The method as described in claim 1, wherein the step of sensing a system voltage level greater than said first voltage level comprises the steps of:
   i) monitoring a system voltage;
   ii) comparing the system voltage to said predetermined first voltage level; and
   iii) recognizing the state wherein the system voltage level is greater than said first voltage level.

13. The method as described in claim 1, wherein the step of monitoring battery parameters indicative of battery performance during a battery discharge comprises the steps of:
   i) measuring a set of battery parameters at a time (t), including battery voltage (V), discharge current (I), and battery temperature (T); and
   ii) storing the values of said set of battery parameters.

14. A method of monitoring the health and condition of a battery in an electrical system, comprising the steps of:
   a) initiating a battery discharge by reducing the voltage supplied by a main power supply from a normal voltage to a predetermined floor voltage;
   b) sensing a system voltage supplied by a battery power supply greater than said floor voltage;
   c) monitoring battery parameters indicative of battery performance during the battery discharge;
   d) terminating the battery discharge by increasing the voltage supplied by the main power supply to said normal voltage; and
   e) using said battery parameters to determine the condition of the battery power supply.

15. A method of monitoring the health and condition of a battery in an electrical system, comprising the steps of:
   a) providing an electrical system wherein the system voltage is primarily supplied by a main power supply and secondarily supplied by a battery power supply;
   b) initiating a battery discharge by reducing the voltage supplied by the main power supply from a normal voltage level to a predetermined first voltage level;
   c) sensing a system voltage level as supplied by the battery power supply greater than said first voltage level;
   d) further reducing the voltage supplied by the main power supply to a predetermined second voltage level;
   e) monitoring battery parameters indicative of battery performance during the battery discharge;
   f) sensing the system voltage supplied by the battery power supply less than or equal to a third predetermined voltage level;
   g) terminating the battery discharge by increasing the voltage level supplied by the main power supply to said normal voltage level; and
   h) using said battery parameters to determine the condition of the battery power supply.

16. The method as described in claim 15, wherein said third predetermined voltage level is greater than said second predetermined voltage level.

17. The method as described in claim 15, wherein the step of sensing a system voltage level less than or equal to a third predetermined voltage level comprises the steps of:
   i) monitoring a system voltage;
   ii) comparing the system voltage to said predetermined third voltage level; and
   iii) recognizing the state wherein the system voltage level is less than or equal to said third voltage level.

18. The method as described in claim 15, wherein the step of providing an electrical system further comprises:
   i) providing an electrical system wherein the system voltage is primarily supplied by a rectifier circuit connected to said main power supply, and wherein said rectifier circuit is adjustable such that it is capable of supplying varying voltage levels.

19. A method of directing an intelligent battery discharge in an electrical system, comprising the steps of:
   a) reducing the voltage supplied by a main power supply from a normal voltage level to a predetermined first voltage level;
   b) sensing a system voltage level as supplied by a battery power supply greater than said first voltage level;
   c) further reducing the voltage supplied by the main power supply to a predetermined second voltage level;
   d) sensing the system voltage supplied by the battery power supply less than or equal to a third predetermined voltage level; and
   e) increasing the voltage level supplied by said main power supply to said normal voltage level.

20. The method as described in claim 19, wherein said third predetermined voltage level is greater than said second predetermined voltage level.

21. Apparatus for determining the condition and health of a battery in an electrical system, comprising:
   a main power supply connected to primarily supply voltage to an electrical system;
   a battery power supply connected to secondarily supply voltage to the electrical system;
   voltage adjusting circuitry connected to adjust the voltage supplied by the main power supply;
   sensing circuitry connected to monitor system voltage and battery performance parameters;
   a battery diagnostic unit connected to receive input from the sensing circuitry, and to provide output to the voltage adjusting circuitry, having:
      a controller, wherein the controller uses input from the sensing circuitry during a battery discharge to determine the condition of said battery power supply.

22. The apparatus as described in claim 21, wherein said sensing circuitry comprises:
   voltage sensing circuitry connected for sensing a voltage (V) of the electrical system;
   current sensing circuitry connected for sensing a discharge current (I) of the battery power supply; and a temperature sensing device positioned for sensing a temperature (T) of the battery supply.

23. The apparatus as described in claim 21, wherein said controller adjusts said voltage adjusting circuitry to control the voltage supplied by the main power supply.

24. The apparatus as described in claim 21, wherein said controller initiates a battery discharge.

25. The apparatus as described in claim 21, wherein said controller initiates a battery discharge by adjusting said voltage adjusting circuitry to reduce the voltage supplied by the main power supply.

26. The apparatus as described in claim 21, wherein said battery diagnostic unit further comprises memory to store said input from the sensing circuitry.

27. The apparatus as described in claim 21, wherein said controller includes instructions for determining battery capacity from said battery parameters in order to determine the condition of said battery power supply.

28. The apparatus as described in claim 21, wherein said controller includes instructions for using said battery parameters to determine a calculated battery capacity and an actual battery capacity;

comparing said calculated battery capacity to said actual battery capacity; and using the comparison between said calculated battery capacity and said actual battery capacity to determine the condition of said battery power supply.

29. The apparatus as described in claim 21, wherein said battery parameters include a battery voltage (V), discharge current (I), and battery temperature (T).

30. Apparatus for determining the condition and health of a battery used as a secondary power supply in an electrical system, comprising:

voltage adjusting circuitry connected to adjust the voltage supplied to an electrical system;

sensing circuitry connected to monitor system voltage and battery performance parameters;

a battery diagnostic unit connected to receive input from the sensing circuitry, and to provide output to the voltage adjusting circuitry, having:

a controller, wherein the controller uses input from the sensing circuitry during a battery discharge to determine the condition of the battery.

* * * * *